United States Patent
Nam et al.

(10) Patent No.: US 10,003,044 B2
(45) Date of Patent: Jun. 19, 2018

(54) COVER WINDOW FOR A DISPLAY DEVICE, AND A DISPLAY DEVICE INCLUDING THE SAME

(71) Applicant: SAMSUNG DISPLAY CO., LTD., Yongin, Gyeonggi-Do (KR)

(72) Inventors: Seung Wook Nam, Chungcheongnam-do (KR); Kyu Young Kim, Gyeonggi-do (KR); Ah Young Kim, Gyeonggi-do (KR); Gui-nam Min, Gyeonggi-do (KR); Kyu-Taek Lee, Chungcheongnam-do (KR); Yong Cheol Jeong, Gyeonggi-do (KR); So Yeon Han, Seoul (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 145 days.

(21) Appl. No.: 14/332,833

(22) Filed: Jul. 16, 2014

(65) Prior Publication Data

US 2015/0086763 A1    Mar. 26, 2015

(30) Foreign Application Priority Data

Sep. 24, 2013 (KR) .......... 10-2013-0113512

(51) Int. Cl.
*H01L 51/52* (2006.01)
*B32B 7/02* (2006.01)
(Continued)

(52) U.S. Cl.
CPC ............ *H01L 51/524* (2013.01); *B32B 3/263* (2013.01); *B32B 7/02* (2013.01);
(Continued)

(58) Field of Classification Search
CPC .. B32B 5/14; B32B 5/142; B32B 7/02; B32B 3/26; B32B 3/263; B32B 3/00;
(Continued)

(56) References Cited

U.S. PATENT DOCUMENTS

| 9,189,027 B2* | 11/2015 | Lee .................. G06F 1/1652 |
| 2010/0201603 A1* | 8/2010 | Kee .................. G06F 1/1601 345/1.3 |

(Continued)

FOREIGN PATENT DOCUMENTS

| KR | 1020110062786 | 6/2011 |
| KR | 1020110068060 | 6/2011 |

(Continued)

OTHER PUBLICATIONS

Machine translation (Espacenet) of KR 10-2011-0062786 A. Translated Mar. 7, 2016.*

*Primary Examiner* — Maria V Ewald
*Assistant Examiner* — Ethan A. Utt
(74) *Attorney, Agent, or Firm* — F. Chau & Associates, LLC

(57) ABSTRACT

A cover window for a display device includes a base film and a coating layer disposed on the base film. The base film includes a plurality of layers. Each of the plurality of layers includes a folding part and a nonfolding part. Each of the plurality of layers has a different coefficient of thermal expansion.

10 Claims, 9 Drawing Sheets

(51) Int. Cl.
  *B32B 3/26* (2006.01)
  *G02F 1/1333* (2006.01)
  *H04M 1/02* (2006.01)
(52) U.S. Cl.
  CPC ............ *G02F 2001/133331* (2013.01); *G02F 2201/503* (2013.01); *H01L 2251/5338* (2013.01); *H01L 2251/558* (2013.01); *H04M 1/0266* (2013.01); *Y02A 30/50* (2018.01); *Y10T 428/24942* (2015.01)
(58) Field of Classification Search
  CPC ................ Y10T 428/24942–428/24992; Y10T 428/24479–428/2462; Y10T 428/24521; Y10T 428/24529; Y10T 428/24612; G09F 9/00; G09F 9/30; G09F 9/301; G06F 1/16; G06F 1/1652; G02B 1/04; G02B 1/10; G02B 1/105; G02B 1/14; G02F 1/1333; G02F 1/133305; G02F 1/133345
  USPC .................................. 428/212–220, 156–173
  See application file for complete search history.

(56) References Cited

U.S. PATENT DOCUMENTS

| | | |
|---|---|---|
| 2011/0045239 A1 | 2/2011 | Takaya et al. |
| 2011/0210937 A1* | 9/2011 | Kee .......................... G06F 3/041 345/173 |
| 2012/0037928 A1* | 2/2012 | Shim ..................... G02B 5/3083 359/488.01 |
| 2012/0170257 A1 | 7/2012 | Van Dijk et al. |
| 2012/0172477 A1* | 7/2012 | Huang ....................... C09J 4/06 522/33 |
| 2013/0004700 A1 | 1/2013 | Jo et al. |
| 2013/0034685 A1 | 2/2013 | An et al. |
| 2013/0108806 A1 | 5/2013 | Han et al. |

FOREIGN PATENT DOCUMENTS

| | | |
|---|---|---|
| KR | 1020120136270 | 12/2012 |
| KR | 1020130038726 | 4/2013 |

\* cited by examiner

COVER WINDOW FOR A DISPLAY DEVICE, AND A DISPLAY DEVICE INCLUDING THE SAME

CROSS-REFERENCE TO RELATED APPLICATION

This application claims priority under 35 U.S.C. § 119 to Korean Patent Application No. 10-2013-0113512 filed in the Korean Intellectual Property Office on Sep. 24, 2013, the disclosure of which is incorporated by reference herein in its entirety.

(a) TECHNICAL FIELD

The present invention relates to a cover window for a display device, and more particularly to a display device including the same.

(b) DISCUSSION OF THE RELATED ART

A variety of mobile electronic devices such as mobile phones, navigation systems, digital cameras, electronic books, portable game machines, and various terminals may include a liquid crystal display (LCD) or an organic light emitting diode (OLED) display.

A display device may have a transparent cover window which is provided at the front of a display panel and through which a user can see a display unit. When the cover window is formed at the outermost position of the display device, the window may be resistant to external impact and may protect the display panel inside the display device.

A structure employing a touch panel having a display screen integrated therein may be used as an input device. When the surface of the cover window is contacted with a finger or the like, the window may require greater strength.

A cover window of the display device may include a foldable member having flexibility.

The strength and the flexibility of the cover window may have a trade-off relationship with each other. The foldable member having flexibility may include a plastic film. The cover window may be thermally transformed at a high temperature when the foldable member is in the folded state.

SUMMARY

Exemplary embodiments of the present invention provide a cover window for a display device having surface thermal resistance that is greater than a predetermined resistance while being foldable, and a display device including the same.

A cover window for a display device according to an exemplary embodiment of the present invention includes a base film and a coating layer disposed on the base film. The base film includes a plurality of layers. Each of the plurality of layers includes a folding part and a nonfolding part. Each of the plurality of layers has a different coefficient of thermal expansion.

The base film may include an upper layer and a lower layer. The upper layer may include a material having a higher coefficient of thermal expansion than that of a material included in the lower layer.

A thickness of the folding part of the lower layer may be about 80% to about 120% as thick as a total thickness of the folding part of the upper layer.

The thickness of the nonfolding part of the lower layer may be about 5% to about 20% as thick as a total thickness of the nonfolding part of the upper layer.

The upper layer may include one of polyethylene naphthalate (PEN), polymethylmethacrylate (PMMA), polyurethane (PU), polyethylene terephthalate (PET), polyimide (PI), or polycarbonate (PC) and the lower layer may include a different one of PEN, PMMA, PU, PET, PI or PC than the upper layer.

The upper layer and the lower layer may be adhered to each other by a liquid adhesive.

A thickness of the liquid adhesive may be in a range of about 1 μm to about 10 μm.

A base film according to another exemplary embodiment of the present invention may include an upper layer, a middle layer, and a lower layer. The upper layer may include a material having a higher coefficient of thermal expansion than that of a material included in the middle layer. The middle layer may include a material having a higher coefficient of thermal expansion than that of a material included in the lower layer.

The thickness of each folding part of the middle layer and the lower layer may be about 80% to about 120% as thick as a total thickness of the folding part of the upper layer.

The thickness of each nonfolding part of the middle layer and the lower layer may be about 5% to about 20% as thick as a total thickness of the nonfolding part of the upper layer.

The upper layer may include one of PEN, PMMA, PU, PET, PI or PC. The middle layer may include a different one of PEN, PMMA, PU, PET, PI or PC than the upper layer. The lower layer may include a different one of PEN, PMMA, PU, PET, PI or PC from the upper layer and the middle layer. A display device according to an exemplary embodiment of the present invention includes a display panel and a cover window disposed on the display panel. The cover window includes a base film and a coating layer disposed on the base film. The base film includes a plurality of layers. Each of the plurality of layers has a different coefficient of thermal expansions.

The base film may include a folding part and a nonfolding part.

The base film may include an upper layer and a lower layer. The upper layer may include a material having a higher coefficient of thermal expansion than that of a material included in the lower layer.

The base film may include an upper layer, a middle layer and a lower layer. The upper layer may include a material having a higher coefficient of thermal expansion than that of a material included in the middle layer. The middle layer may include a material having a higher coefficient of thermal expansion than that of a material included in the lower layer.

The upper layer may include one of PEN, PMMA, PU, PET, PI or PC. The middle layer may include a different one of PEN, PMMA, PU, PET, PI or PC than the upper layer. The lower layer may include a different one of PEN, PMMA, PU, PET, PI or PC from the upper layer and the middle layer.

The display panel may be an organic light emitting panel or a liquid crystal panel.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE EMBODIMENTS

Figure 1:
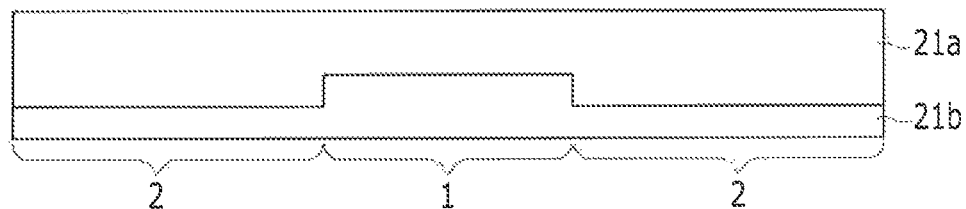
FIG. 1 is a cross-sectional view showing a base film part of a cover window of a display device according to an exemplary embodiment of the present invention.

Exemplary embodiments of the present invention will be described more fully hereinafter with reference to the accompanying drawings. The present invention may be embodied in different forms, and should not be construed as limited to the embodiments set forth herein.

In the drawings, the thickness of layers, films, panels, regions, etc., may be exaggerated for clarity. Like reference numerals may designate like elements throughout the specification and drawings. It will be understood that when an element such as a layer, film, region, or substrate is referred to as being "on" another element, it can be directly on the other element or intervening elements may also be present.

A cover window for a display device and a display device including the same according to an exemplary embodiment of the present invention will now be described more fully with reference to accompanying drawings.

A base film 21 of a cover window 20 of a display device according to an exemplary embodiment of the present invention will be described more fully with reference to FIG. 1.

FIG. 1 is a cross-sectional view showing a base film part of a cover window of a display device according to an exemplary embodiment of the present invention.

The base film 21 according to an exemplary embodiment of the present invention may include a dual layer including an upper layer 21a and a lower layer 21b. A material included in the upper layer 21a of the base film 21 may have a higher coefficient of thermal expansion (CTE) than that of a material included in the lower layer 21b of the base film 21.

The base film 21 according to an exemplary embodiment of the present invention includes a folding part 1 and a nonfolding part 2.

The folding part 1 of the base film 21 corresponds to a part where the flexible display is folded, and the nonfolding part 2 corresponds to a part where the flexible display is not folded.

A thickness of the lower layer 21b of the folding part 1 may be about 80-120% as thick as a thickness of the upper layer 21a of the folding part 1. A thickness of the lower layer 21b of the nonfolding part 2 may be about 5-20% as thick as a thickness of the upper layer 21a of the nonfolding part 2.

The thickness of the nonfolding part 2 of the lower layer 21b may be smaller than that of the folding part 1 of the lower layer 21b.

The thickness of the folding part 1 of the lower layer 21b may be in a range of about 25 μm to about 165 μm.

The thickness of the nonfolding part 2 of the lower layer 21b may be in a range of about 2 μm to about 50 μm.

When the thickness of the lower layer 21b of the folding part 1 is about 80-120% of the thickness of the upper layer 21a, the folding part 1 of the lower layer 21b may maximize a force that is applied in a direction opposite to a direction that the flexible display is folded. The flexible display may be thermally transformed by a difference between a CTE of the upper layer 21a and a CTE of the lower layer 21b of the base film 21 generated when heat is applied to the flexible display when the flexible display is in a folded state.

When the thickness of the lower layer 21b of the nonfolding part 2 is about 5-20% of the thickness of the upper layer 21a of the nonfolding part 2, the lower level 21b of the nonfolding part 2 may minimize the transformation by the CTE difference between the upper layer 21a and the lower layer 21b of the base film 21 when heat is applied to the flexible display when the nonfolding part 2 is not folded.

When the lower layer 21b is not formed in the nonfolding part 2, the folding part 1 may include the dual layer of the upper layer 21a and the lower layer 21b, and the nonfolding part 2 may include a single layer of the upper layer 21a. An image between the folding part 1 including the dual layer and the nonfolding part 2 including the single layer may be distorted by a refractive index difference between the single layer and the dual layer.

A combined thickness of the upper layer 21a and the lower layer 21b of the base film 21 may be in a range of about 50 μm to about 300 μm.

The base film 21 may include polyethylene naphthalate (PEN), polymethylmethacrylate (PMMA,), polyurethane (PU,), polyethylene terephthalate (PET), polyimide (PI), or polycarbonate (PC).

When folding the flexible display in the direction of the upper layer 21a of the base film 21, tension may be generated at an outer side (e.g., the lower layer 21b) of the base film 21 and stress may be generated in an inner side (e.g., the upper layer 21a) and a thermal transformation of the base film 21 may be generated. The upper layer 21a of the base film 21 may be disposed inside the folding part 1 when the folded base film 21 includes a material having a relatively high CTE. A force may act on the base film 21 in the direction opposite to the direction that the thermal transformation is generated by the expansion of the upper layer 21a in the direction of the lower layer 21b. The upper layer 21a may expand in the direction opposite to the folding direction to decrease a degree of the thermal transformation of the base film 21.

The CTEs of exemplary materials included in the base film 21 are shown in Table 1 below. A combination of two materials may be included in the lower layer 21b. The upper layer 21a may include a material having a higher CTE than a material included in the lower layer 21b.

TABLE 1

| Material | Coefficient of thermal expansion (CTE) |
|---|---|
| PI | 58 ppm/° C. |
| PC | 70 ppm/° C. |
| PU | 210 ppm/° C. |
| PEN | 20 ppm/° C. |
| PMMA | 20 ppm/° C. |
| PET | 30 ppm/° C. |

According to an exemplary embodiment of the present invention, in a combination of the materials of the upper layer 21a and the lower layer 21b, the lower layer 21b may include PC and the upper layer 21a may include PU. According to an exemplary embodiment of the present invention, in a combination of materials of the upper layer 21a and the lower layer 21b, the lower layer 21b may include PI and the upper layer 21a may include PC. However, exemplary embodiments of the present invention are not limited thereto. When comparing the CTE between a material included in the upper layer 21a and a material included in the lower layer 21b, the material having the lower CTE may be included in the lower layer 21b and the material having the higher CTE may be included in the upper layer 21a.

The upper layer 21a and the lower layer 21b of the base film 21 may be adhered to each other by a liquid adhesive. When an adhesive layer (not shown) is relatively thick, the thermal transformation by the CTE difference of the upper layer 21a and the lower layer 21b may be relatively large. The liquid adhesive may be used and a solid adhesive might not be used.

The thickness of the adhesive layer (not shown) may be in a range of about 1 μm to about 10 μm.

A cover window of a display device according to an exemplary embodiment of the present invention will now be described more fully with reference to FIG. 2.

Figure 2:
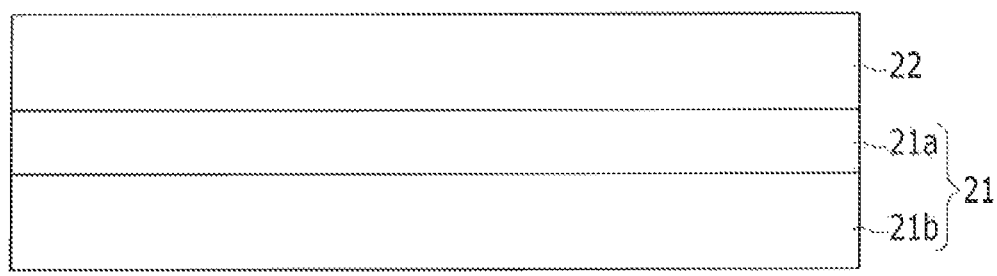
FIG. 2 is a cross-sectional view of a cover window of a display device according to an exemplary embodiment of the present invention.

FIG. 2 is a cross-sectional view of a cover window 20 of a display device according to an exemplary embodiment of the present invention.

A base film 21 according to an exemplary embodiment of the present invention may include a dual layer formed of an upper layer 21a and a lower layer 21b. In the upper layer 21a and the lower layer 21b of the base film 21 including the dual layer, a material included in the upper layer 21a of the base film 21 may have a higher CTE than that of the material included in the lower layer 21b of the base film 21.

Referring to FIG. 2, in the base film 21 of the display device according to an exemplary embodiment of the present invention, the thicknesses of a folding part and a nonfolding part of the upper layer 21a and the lower layer 21b may be the same. The thickness of the upper layer 21a may be different than the thickness of the lower layer 21b.

A coating layer 22 may be formed on the base film 21 including the dual layer including the upper layer 21a and the lower layer 21b having the different CTEs. The coating layer 22 may include an acryl-based hard coating or an organic/inorganic hybrid hard coating, for example.

The upper layer 21a and the lower layer 21b of the base film 21 may be adhered to each other by a liquid adhesive. When an adhesive layer (not shown) is relatively thick, the thermal transformation by the CTE difference of the upper layer 21a and the lower layer 21b may be relatively large. The liquid adhesive may be used and a solid adhesive may not be used.

The thickness of adhesive layer (not shown) may be in a range of about 1 μm to about 10 μm.

For example, when the upper layer 21a and the lower layer 21b include a combination of PI, PC, and PU and the upper layer 21a and the lower layer 21b are folded and unfolded at 85° C., a number of transformation angles may be formed. Experimentally observed transformation angles are shown in Table 2 below.

A flexible display in a flat state may have a transformation angle of 0 degrees. A flexible display in a completely folded state may have a transformation angle of 180 degrees. The transformation angle may be an angle formed when the flexible display is folded from a bottom surface when the flexible display is folded and unfolded at 85° C.

TABLE 2

| | Deposition structure | | Transformation |
|---|---|---|---|
| | upper layer | lower layer | angle |
| 1 | PU | PC | 80 degrees |
| 2 | PC | PU | 100 degrees |
| 3 | PC | PI | 115 degrees |
| 4 | PI | PC | 123 degrees |

As shown in Table 2, in Experimental Example 1 and Experimental Example 3, the upper layer 21a is formed of the material having the relatively higher CTE. In Experimental Example 2 and Experimental Example 4, the lower layer 21b is formed of the material having the relatively higher CTE.

When the upper layer 21a includes the material having the relatively higher CTE compared with the lower layer 21b, the transformation angle of the flexible display may be relatively small.

A base film 21 of a cover window 20 according to an exemplary embodiment of the present invention will now be described more fully with reference to FIG. 3.

Figure 3:
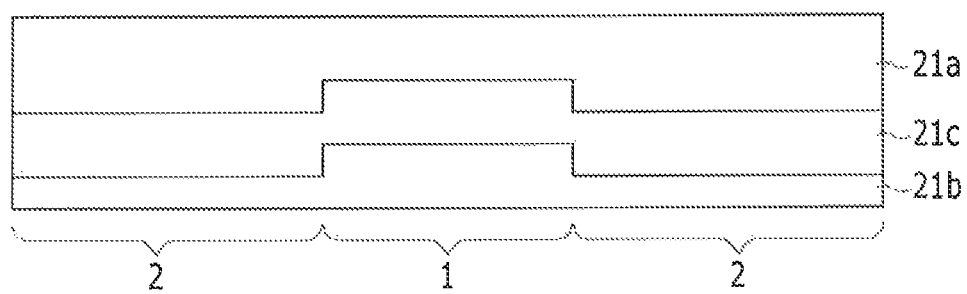
FIG. 3 is a cross-sectional view showing a base film part of a cover window of a display device according to an exemplary embodiment of the present invention.

FIG. 3 is a cross-sectional view of a base film of a cover window of a display device according to an exemplary embodiment of the present invention.

Referring to FIG. 3, the base film 21 according to an exemplary embodiment of the present invention may include a triple layer formed of an upper layer 21a, a middle layer 21c, and a lower layer 21b. The CTE of the material included in the upper layer 21a of the base film 21 may be higher than the CTE of the material included in the middle layer 21c and the lower layer 21b of the base film 21.

The CTE of the material included in the middle layer 21c of the base film 21 may be higher than the CTE of the material included in the lower layer 21b and lower than the CTE of the material included in the upper layer 21a of the base film 21.

The base film 21 according to an exemplary embodiment of the present invention may include a folding part and a nonfolding part.

The lower layer 21b and the middle layer 21c of the folding part 1 may be about 80-120% as thick as a thickness of the upper layer 21a of the folding part 1. The lower layer 21b and the middle layer 21c of the nonfolding part 2 may be about 5-20% as thick as the thickness of the upper layer 21a of the nonfolding part 2.

The thickness of the nonfolding part 2 of the lower layer 21b may be smaller than that of the folding part 1 of the lower layer 21b.

The thickness of the folding part 1 of the lower layer 21b may be in a range of about 25 µm to about 165 µm.

The thickness of the nonfolding part 2 of the lower layer 21b may be in a range of about 2 µm to about 50 µm.

When the thickness of the lower layer 21b and the middle layer 21c of the folding part 1 are 80-120% of the thickness of the upper layer 21a, the folding part 1 of the lower layer 21b and the folding part 1 of the middle layer 21c may maximize a force that is applied in the direction opposite to a direction that the flexible display is folded. The flexible display may be thermally transformed by a difference between a CTE of the upper layer 21a, a CTE of the middle layer 21c, and a CTE of the lower layer 21b of the base film 21 generated when heat is applied to the flexible display when the flexible display is in a folded state.

When the thickness of the lower layer 21b and the middle layer 21c of the nonfolding part 2 is about 5-20% of the thickness of the upper layer 21a of the nonfolding part 2, the nonfolding part 2 may minimize the transformation by the CTE between the upper layer 21a, the middle layer 21c, and the lower layer 21b of the base film 21 when heat is applied to the flexible display when the nonfolding part 2 is not folded.

When the lower layer 21b and the middle layer 21c are not formed in the nonfolding part 2, the folding part 1 may include the triple layer of the upper layer 21a, the middle layer 21c, and the lower layer 21b and the nonfolding part 2 may include a single layer of the upper layer 21a. An image between the folding part 1 including the triple layer and the nonfolding part 2 including the single layer may be distorted by a refractive index difference between the single layer and the triple layer.

A combined thickness of the upper layer 21a, the middle layer 21c, and the lower layer 21b of the base film 21 may be in the range of about 50 µm to about 300 µm.

The base film 21 may include PEN, PMMA, PU, PET, PI, or PC.

The upper layer 21a, the middle layer 21c, and the lower layer 21b of the base film 21 may be adhered to each other by a liquid adhesive. When an adhesive layer (not shown) is relatively thick, the thermal transformation by the CTE difference of the upper layer 21a, the middle layer 21c, and the lower layer 21b may be relatively large. The liquid adhesive may be used and a solid adhesive might not be used.

The adhesive layer (not shown) may be in a range of about 1 µm to about 10 µm thick between the upper layer 21a and the middle layer 21c and between the middle layer 21c and the lower layer 21b.

The base film 21 of the cover window 20 according to an exemplary embodiment of the present invention will now be described more fully with reference to FIG. 4.

Figure 4:
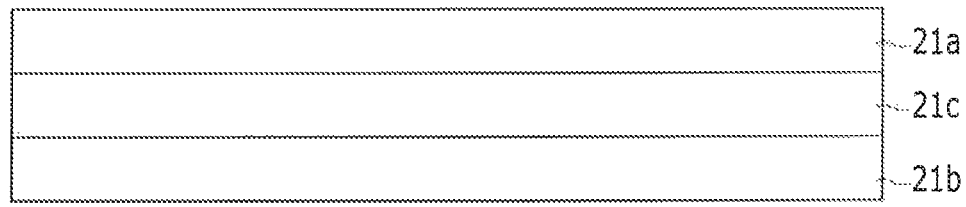
FIG. 4 is a cross-sectional view showing a base film part of a cover window of a display device according to an exemplary embodiment of the present invention.

FIG. 4 is a cross-sectional view showing a base film part of a cover window of a display device according to an exemplary embodiment of the present invention.

Referring to FIG. 4, in the base film 21 of the display device according to an exemplary embodiment of the present invention the thicknesses of a folding part and a nonfolding part may be the same. The upper layer 21a, the middle layer 21c, and the lower layer 21b may have different thicknesses from each other.

A combined thickness of the upper layer 21a, the middle layer 21c, and the lower layer 21b of the base film 21 may be in a range of about 50 µm to about 300 µm.

The base film 21 may include PEN, PMMA, PU, PET, PI, or PC.

The upper layer 21a, the middle layer 21c, and the lower layer 21b of the base film 21 may be adhered to each other by a liquid adhesive. When the adhesive layer (not shown) is relatively thick, the thermal transformation by the CTE difference of the upper layer 21a, the middle layer 21c, and the lower layer 21b may be relatively large. The liquid adhesive may be used and a solid adhesive might not be used.

The adhesive layer (not shown) may be in a range of about 1 µm to about 10 µm thick between the upper layer 21a and the middle layer 21c and between the middle layer 21c and the lower layer 21b.

The cover window 20 of the display device according to an exemplary embodiment of the present invention will now be described more fully with reference to FIG. 5.

Figure 5:
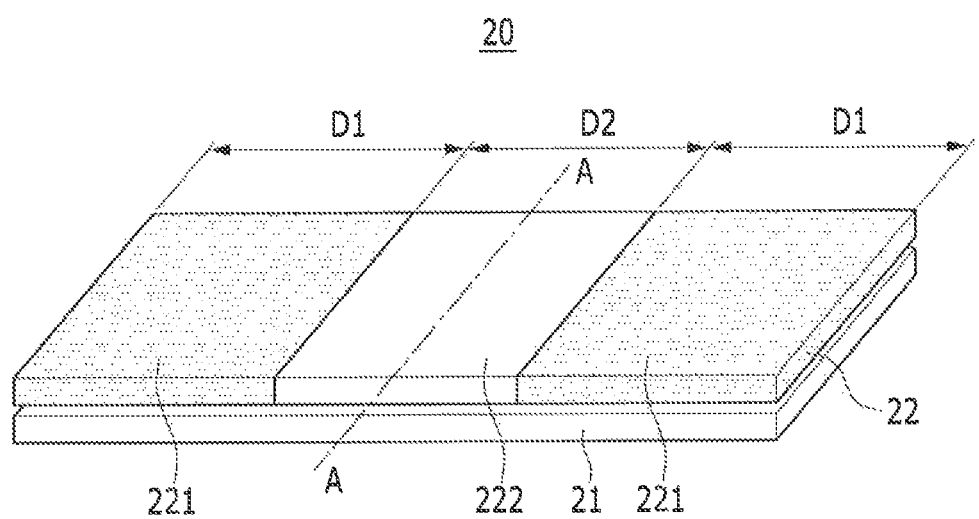
FIG. 5 is a perspective view of a part of a cover window of a display device according to an exemplary embodiment of the present invention.

FIG. 5 is a perspective view of a part of a cover window of a display device according to an exemplary embodiment of the present invention.

As shown in FIG. 5, the cover window 20 may include the base film 21 and the coating layer 22 formed on the base film 21.

The coating layer 22 may include a first region D1 and a second region D2. A hardness of the first region D1 and a hardness of the second region D2 may be different from each other.

The second region D2 may be disposed between two first regions D1. The second region D2 may include a line A-A along which the display device may be bent. The second region D2 may be configured to be bent with less force than the first regions D1. The first regions D1 may be harder than the second region D2. When the display device is bent along the line A-A, the cover window 20 may also be bent. When the first regions D1 are hard, they may protect the display panel.

The first regions D1 of the coating layer 22 may include hard members 221 and the second region D2 of the coating layer 22 may include a flexible member 222. The entirety of the first regions D1 may include the hard members 221 and the entirety of the second region D2 may include the flexible member 222.

The hard members 221 may include a material having a higher degree of hardness than that of the flexible member 222. The hard members 221 may be bendable. The flexible member 222 may be more bendable than the hard members 221.

The cover window 20 of the display device according to an exemplary embodiment of the present invention may include the coating layer 22 including portions having different degrees of hardness formed on the base film 21. The cover window 20 may be bendable and may have a surface hardness that is greater than a predetermined level of surface hardness. The first regions D1 of the coating layer 22 may be configured to bend the display panel. The second region D2 may be configured to protect the display panel.

Hereinafter, a method for manufacturing the cover window of the display device according to an exemplary embodiment of the present invention will now be described more fully with reference to FIG. 6.

Figure 6:
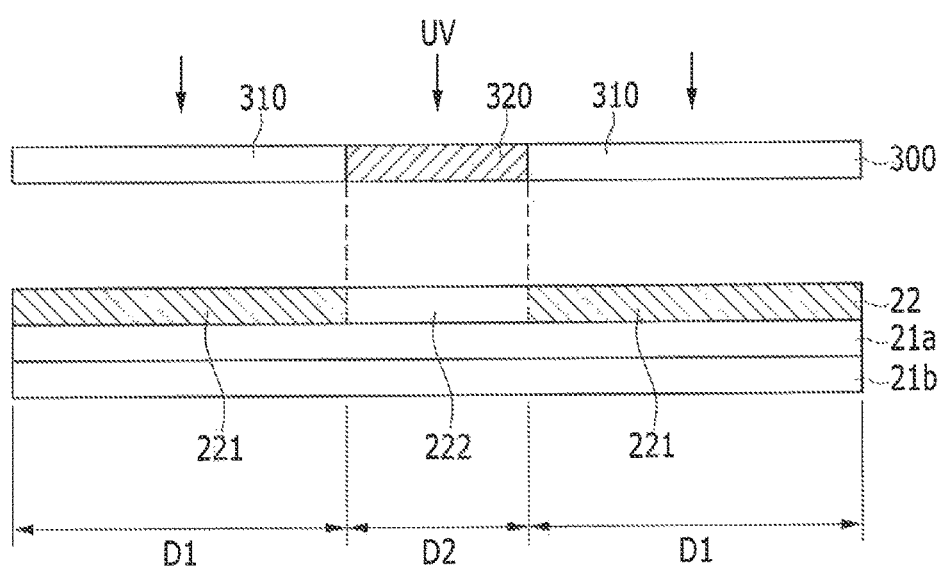
FIG. 6 is a process cross-sectional view showing a manufacturing method of a cover window of a display device according to an exemplary embodiment of the present invention.

FIG. 6 is a process cross-sectional view showing a manufacturing method of a display device according to an exemplary embodiment of the present invention.

A base film 21 including an upper layer 21a and a lower layer 21b may be formed. The base layer 21 may include PEN, PMMA, PU, PET, PI, and/or PC.

The base film 21 may include the dual layer of the upper layer 21a and the lower layer 21b. The upper layer 21a and the lower layer 21b of the base film 21 including the dual layer may be respectively formed of one material. The one material may include one or more of the above disclosed polymer materials. The CTE of the material included in the upper layer 21a of the base film 21 may be higher than the CTE of the material included in the lower layer 21b of the base film 21. The material included in the lower layer 21b of the base film 21 may have a lower CTE than the material included in the upper layer 21a of the base film 21.

For example, the lower layer 21b may include PC and the upper layer 21a may include PU, or the lower layer 21b may include PI and the upper layer 21a may include PC. However, the present invention is not limited thereto. The material having the relatively low CTE may be included in the lower layer 21b and the material including the relatively high CTE may be used in the upper layer 21a by comparing the CTEs.

A coating layer 22 may be formed on the base film 21. The coating layer 22 may be formed by using an acrylic hard coating process or an organic/inorganic hybrid hard coating process, for example.

As illustrated in FIG. 6, a mask 300 may be disposed above the coating layer 22 in a corresponding location. Ultraviolet (UV) light may be radiated to cure the coating layer 22.

The mask 300 may include a transmissive part 310 and a semi-transmissive part 320. UV light radiated to the transmissive part 310 of the mask 300 may pass through the mask 300. A partial amount of UV light may be radiated to the semi-transmissive part 320 of the mask 300, may pass through the mask 300 and a remaining amount of UV light may be absorbed by the mask 300.

The transmissive part 310 may correspond to first regions D1 of the coating layer 22, and the semi-transmissive part 320 of the mask 300 may correspond to a second region D2 of the coating layer 22. A relatively large amount of UV light may be radiated to the first regions D1 of the coating layer 22, relative to the second region D2. The first regions D1 may be cured to be harder than the second region D2. The first regions D1 may become the hard members 221 and the second region D2 becomes the flexible member 222.

In the cover window 20 of the display device according to an exemplary embodiment of the present invention, the same material may be included the coating layer 22. The first regions D1 and the second region D2 of the coating layer 22 may be subsequently cured under different conditions and the coating layer 22 may include regions having different degrees of hardness.

A deposition structure of a display device using the base film according to an exemplary embodiment of the present invention will be described with reference to FIG. 7 and FIG. 8.

Figure 7:
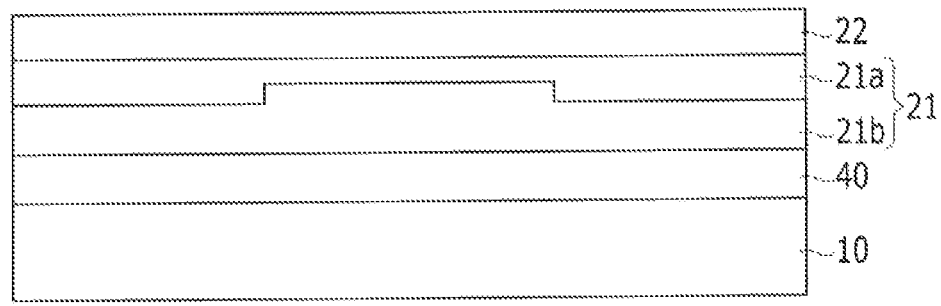
FIG. 7 is a cross-sectional view of a display device according to an exemplary embodiment of the present invention.

FIG. 7 is a cross-sectional view of a display device according to an exemplary embodiment of the present invention. FIG. 8 is a cross-sectional view of the display device of FIG. 7 in a folded state.

Figure 8:
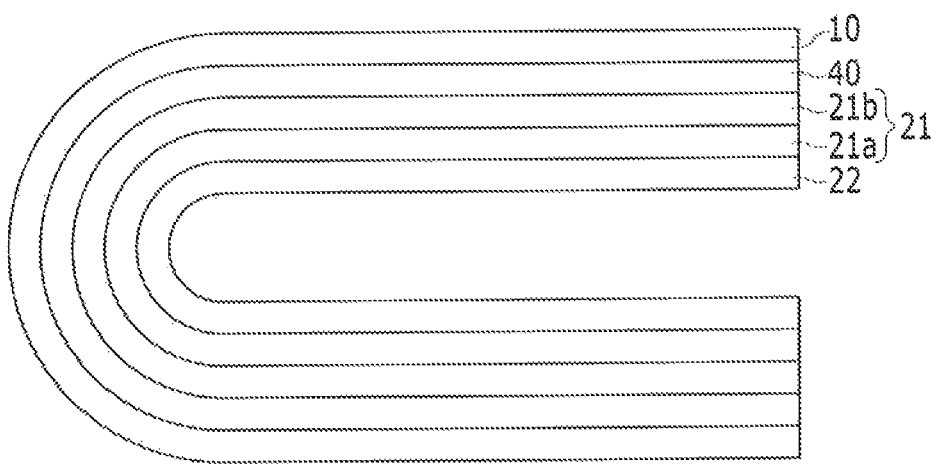
FIG. 8 is a cross-sectional view of the display device of FIG. 7 in a folded state.

Referring to FIG. 7 and FIG. 8, a display device according to an exemplary embodiment of the present invention may include a display panel 10, a polarization member 40, a base film 21 including a plurality of layers, and a coating layer 22.

The polarization film 40 may be disposed on the display panel 10. The base film 21 may include a plurality of layers disposed on the polarization member 40. The coating layer 22 may be disposed on the base film 21.

The display panel 10 may be an organic light emitting display (OLED), for example. The display panel 10 may be another display panel, for example, a liquid crystal display (LCD). The display panel 10 may include a touch panel (not shown), or a touch panel layer may be disposed on the display panel 10.

The polarization member 40 may be disposed on the display panel 10. The polarization member 40 may suppress external light from reflecting off of the display panel 10. The polarization member 40 may increase an optical characteristic of the display panel 10.

The base film 21 may include the dual layer. The dual layer may include the upper layer 21a and the lower layer 21b of the base film 21. The dual layer may include a single material selected from the above disclosed polymer materials. The CTE of the material included in the upper layer 21a of the base film 21 may be higher than the CTE of the material included in the lower layer 21b.

The base film 21 may include the folding part 1 and the nonfolding part 2, as shown in FIG. 1, for example.

The folding part 1 of the base film 21 may correspond to a part where the flexible display is folded, and the nonfolding part 2 may correspond to a part where the flexible display is not folded.

The thickness of the lower layer 21b of the folding part 1 may be about 80-120% as thick as the thickness of the upper layer 21a of the folding part 1. The thickness of the lower layer 21b of the nonfolding part 2 may be about 5-20% as thick as the thickness of the upper layer 21a of the nonfolding part 2.

The thickness of the nonfolding part 2 of the lower layer 21b may be smaller than that of the folding part 1 of the lower layer 21b.

The thickness of the folding part 1 of the lower layer 21b may be in a range of about 25 μm to about 165 μm.

The thickness of the nonfolding part 2 of the lower layer 21b may be in a range of about 2 μm to about 50 μm.

When the thickness of the lower layer 21b of the folding part 1 may be about 80-120% of the thickness of the upper layer 21a, the folding part 1 of the lower layer 21b may maximize the force that acts in the direction opposite to the direction that the flexible display is folded. The flexible display may be thermally transformed by a difference of the CTE of the upper layer 21a and the CIE of the lower layer 21b of the base film 21 generated when heat is applied to the flexible display in the folded state.

When the thickness of the lower layer 21b of the nonfolding part 2 is about 5-20% of the thickness of the upper layer 21a of the nonfolding part 2, the lower level 21b of the nonfolding part 2 may minimize the transformation by the CTE between the upper layer 21a and the lower layer 21b of the base film 21 when heat is applied to the flexible display when the nonfolding part 2 is not folded.

The coating layer 22 may be disposed on the base film 21. The coating layer 22 may include portions having different hardness.

The coating layer 22 may include an acryl-based hard coating or an organic/inorganic hybrid hard coating.

A display device according to an exemplary embodiment of the present invention will now be described with reference to FIG. 9.

Figure 9:
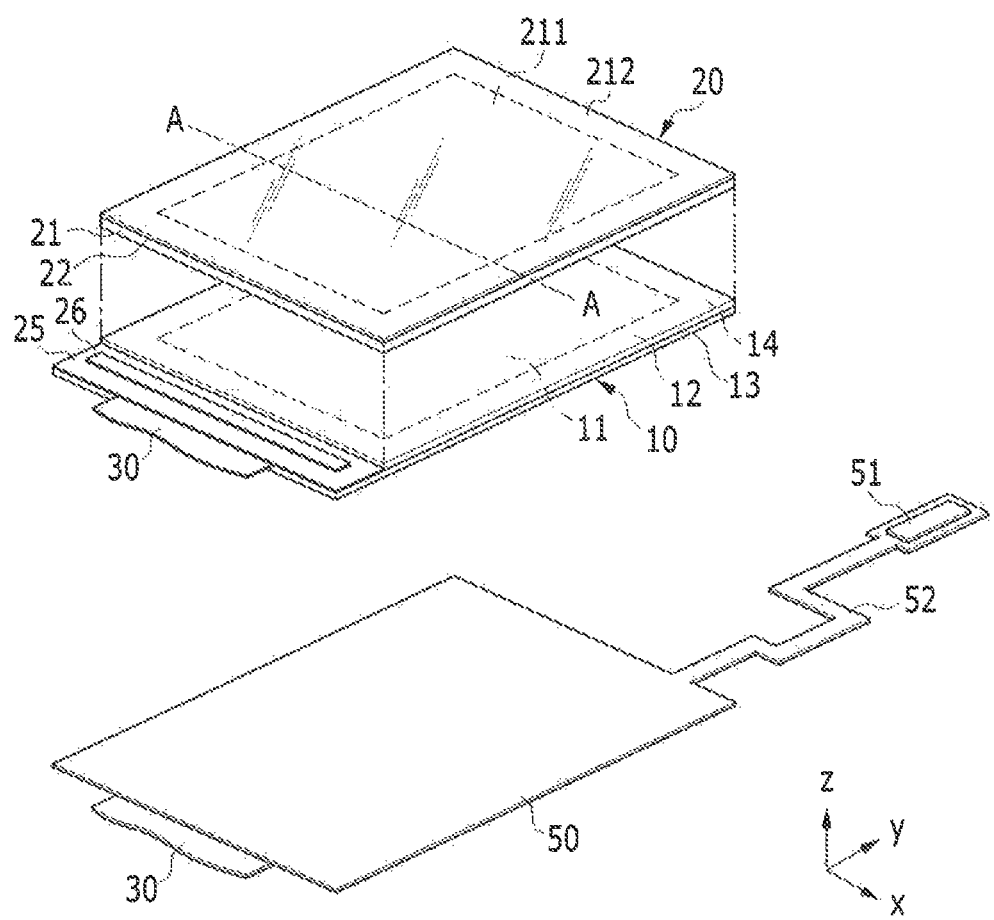
FIG. 9 is an exploded perspective view of a display device according to an exemplary embodiment of the present invention.

FIG. 9 is an exploded perspective view of a display device according to an exemplary embodiment of the present invention.

Referring to FIG. 9, the display device according to an exemplary embodiment of the present invention may include a display panel 10 configured to display images and a cover window 20 disposed on a front side of the display panel 10 and configured to protect the display panel 10.

The display panel 10 may be an OLED, for example. The display panel 10 may be another display, for example, an LCD. In the present exemplary embodiment, for convenience of description, the OLED panel is described as an example; however, the present invention is not limited thereto.

The display panel 10 may be electrically connected to a printed circuit board (PCB) 50 through a flexible printed circuit 30.

Pixels (e.g., basic units for expressing an image) may be arranged in a matrix on a first substrate 13 of the display panel 10. A second substrate 14 of the display panel 10 may be coupled to the first substrate 13 by a sealing member (not shown). The sealing member may protect the pixels. The first substrate 13 may be a rear substrate, and the second substrate 14 may be a front substrate.

For example, in an active matrix organic light emitting display panel, each pixel may include an organic light emitting element (not shown) including an anode electrode, an organic light emitting layer, and a cathode electrode, and a driving circuit unit (not shown) configured to drive the organic light emitting element. The driving circuit unit may be a thin film transistor (TFT), for example. A data line may be connected to a source terminal of the TFT, and a gate line may be connected to a gate terminal of the TFT. Either one of the anode electrode or the cathode electrode of the organic light emitting element may be connected to a drain terminal of the TFT.

The data line and the gate line may be connected to the PCB 50 through the flexible printed circuit 30. When an electrical signal is input to the source terminal and the gate terminal of the TFT through the PCB 50, the TFT may be turned on or off according to the signal input. The TFT may output an electrical signal for driving pixels to the drain terminal.

An integrated circuit (IC) chip 26 may be mounted on the first substrate 13. The IC chip 26 may control the display panel 10.

The IC chip 26 may generate timing signals for applying a data driving signal and a gate driving signal at desired times. The IC chip 26 may apply the generated timing signals to the data line and the gate line of the display panel 10, respectively. A protective layer 25 may be formed around the IC chip 26. The protective layer 25 may protect the IC chip 26.

Electronic elements (not shown) for processing driving signals may be mounted on the PCB 50. The PCB 50 may include a connector 51 and an extending part 52. The extending part 52 may be disposed in one end of the connector 51. The extending part 52 may transmit an external signal to the PCB 50.

The cover window 20 may protect the display panel 10 and may be positioned in front of the display panel 10. The cover window 20 may protect the display panel 10 so that the display panel 10 is not broken due to external impact. The cover window 20 may be attached to the display panel 10 by a predetermined adhesive layer (not shown). The display panel 10 and the cover window 20 may be spaced from one another with an air layer formed therebetween.

The cover window 20 may include a base film 21 and a coating layer 22 formed on the base film 21.

The base film 21 may include a transparent part 211 formed in a region corresponding to a display part 11 of the display panel 10. The transparent part 211 may allow the display part 11 to be visible to the outside. The base film 21 may include an opaque part 212 formed in a region corresponding to a non-display part 12 of the display panel 10. The opaque part 212 may prevent a non-display part 12 from being visible to the outside. The opaque part 212 may shroud wiring, components, and the like formed in the non-display part 12 of the display panel 10. The shrouded wiring, components, and the like may be invisible to the outside. The opaque part 212 may include a logo of a product, a decorative pattern, or the like.

The base film 21 may include PEN, PMMA, PU, PET, PI, or PC.

The base film 21 according to an exemplary embodiment of the present invention may include two or more layers. The base film 21 made of the dual layer, for example, the upper layer 21a and the lower layer 21b of the base film 21, may include a single material selected from the above-disclosed polymer materials. The CTE of the material of the upper layer 21a of the base film 21 may be higher than the CTE of the material included in the lower layer 21b of the base film 21.

When folding the flexible display in the direction of the upper layer 21a of the base film 21, tension may be generated at an outer side (e.g., the lower layer 21b) of the base film 21 and stress may be generated at an inner side (e.g., the upper layer 21a) and a thermal transformation of the base film 21 may be generated. The upper layer of the base film 21 may be disposed inside the folding part when the folded base film 21 includes the material having the higher CTE. The force may act on the base film 21 in the direction opposite to the direction that the thermal transformation is generated by the expansion of the upper layer 21a in the direction of the lower layer 21b. The upper layer 21a may expand the direction opposite to the folding direction to decrease the degree of thermal transformation of the base film 21.

The coating layer 22 may be disposed on the base film 21. The coating layer 22 may include the portions having different hardness.

The coating layer 22 may include the acryl-based hard coating or the organic/inorganic hybrid hard coating.

The display device according to the present exemplary embodiment may include a bendable material. For example, the display device may be bent along the line A-A, and the cover window 20 may also be bent along with the line A-A.

The base film 21 included in the cover window 20 for the display device according to an exemplary embodiment of the present invention may include the dual layer and the triple layer, however the present invention is not limited thereto. The base film 21 may include more than three layers.

As described above, the cover window 20 for the display device and the display device including the same according to an exemplary embodiment of the present invention may include the base film 21 formed of a plurality of layers having different CTEs. The display device according to exemplary embodiments of the present invention may have a thermal resistance of more than a predetermined resistance while being bendable and a transformation of a cover window may be reduced.

While the present invention has been shown and described with reference to the exemplary embodiments thereof, it will be apparent to those of ordinary skill in the art that various changes in form and detail may be made thereto without departing from the spirit and scope of the invention as defined by the claims.

What is claimed is:

1. A cover window for a display device, comprising:
a base film; and
a coating layer disposed on the base film,
wherein the base film includes a plurality of layers, wherein each of the plurality of layers includes a folding part and a nonfolding part, wherein each of the plurality of layers has a different coefficient of thermal expansion, wherein in an unfolded state the folding part of a lowermost layer of the plurality of layers has a greater thickness than the nonfolding part of the lowermost layer of the plurality of layers, wherein a thickness of the folding part of the lowermost layer of the plurality of layers is about 80% to about 120% as thick as a total thickness of the folding part of the layer of the plurality of layers positioned above the lowermost layer of the plurality of layers, and wherein a thickness of the nonfolding part of the lowermost layer of the plurality of layers is about 5% to about 20% as thick as a total thickness of the nonfolding part of the layer of the plurality of layers positioned above the lowermost layer of the plurality of layers.

2. The cover window of claim 1, wherein
the base film further includes an upper layer and a lower layer, and
the upper layer includes a material having a higher coefficient of thermal expansion than that of a material included in the lower layer.

3. The cover window of claim 2, wherein
a thickness of the folding part of the lower layer is about 80% to about 120% as thick as a total thickness of the folding part of the upper layer.

4. The cover window of claim 3, wherein
a thickness of the nonfolding part of the lower layer is about 5% to about 20% as thick as a total thickness of the nonfolding part of the upper layer.

5. The cover window of claim 2, wherein
the upper layer includes one of polyethylene naphthalate (PEN), polymethylmethacrylate (PMMA), polyurethane (PU), polyethylene terephthalate (PET), polyimide (PI), or polycarbonate (PC), the lower layer includes a different one of PEN, PMMA, PU, PET, PI, or PC than the upper layer.

6. The cover window of claim 2, wherein
the upper layer and the lower layer are adhered to each other by a liquid adhesive.

7. The cover window of claim 6, wherein
a thickness of the liquid adhesive is in a range of about 1 μm to about 10 μm.

8. The cover window of claim 1, wherein the folding part of an uppermost layer of the plurality of layers has a smaller thickness than the nonfolding part of the uppermost layer of the plurality of layers.

9. A cover window of claim 1, comprising:
a base film; and
a coating layer disposed on the base film, wherein the base film includes an upper layer, a middle layer, and a lower layer,
wherein the upper layer includes a material having a higher coefficient of thermal expansion than that of a material included in the middle layer,
wherein the middle layer includes a material having a higher coefficient of thermal expansion than that of a material included in the lower layer,
wherein each of the upper layer, the middle layer and the lower layer includes a folding part and a nonfolding part,
wherein a thickness of each folding part of the middle layer and the lower layer is about 80% to about 120% as thick as a total thickness of the folding part of the upper layer, and
wherein a thickness of each nonfolding part of the middle layer and the lower layer is about 5% to about 20% as thick as a total thickness of the nonfolding part of the upper layer.

10. The cover window of claim 9, wherein
the upper layer includes one of polyethylene naphthalate (PEN), polymethylmethacrylate (PMMA), polyurethane (PU), polyethylene terephthalate (PET), polyimide (PI), or polycarbonate (PC), the middle layer includes a different one of PEN, PMMA, PU, PET, PI, or PC than the upper layer, and the lower layer includes a different one of PEN, PMMA, PU, PET, PI, or PC than the upper layer and the middle layer.

* * * * *